(12) United States Patent
Johanson et al.

(10) Patent No.: US 6,405,101 B1
(45) Date of Patent: Jun. 11, 2002

(54) WAFER CENTERING SYSTEM AND METHOD

(75) Inventors: William R. Johanson; Craig Stevens; Steve Kleinke; Damon Genetti, all of San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/434,099

(22) Filed: Nov. 5, 1999

Related U.S. Application Data

(63) Continuation-in-part of application No. 09/343,612, filed on Jun. 30, 1999.
(60) Provisional application No. 60/111,803, filed on Nov. 17, 1998.

(51) Int. Cl.[7] .................................................. G06F 7/00
(52) U.S. Cl. ........................ 700/218; 700/228; 356/73; 901/16; 901/47
(58) Field of Search ................................. 700/218, 228; 356/73; 901/47, 16

(56) References Cited

U.S. PATENT DOCUMENTS

| | | | |
|---|---|---|---|
| 4,724,322 A | * 2/1988 | Knowles et al. | 250/341 |
| 4,819,167 A | 4/1989 | Cheng et al. | 364/167.01 |
| 4,887,904 A | 12/1989 | Nakazato et al. | 356/375 |
| 5,012,523 A | 4/1991 | Kobayashi et al. | 382/145 |
| 5,194,743 A | 3/1993 | Aoyama et al. | 250/548 |
| 5,452,078 A | * 9/1995 | Cheng | 356/150 |
| 5,483,138 A | 1/1996 | Shmookler et al. | 318/568.16 |
| 5,511,934 A | 4/1996 | Bacchi et al. | 414/783 |
| 5,524,131 A | * 6/1996 | Uzawa et al. | 378/34 |
| 5,546,179 A | * 8/1996 | Cheng | 356/73 |
| 5,563,798 A | 10/1996 | Berken et al. | 364/478.06 |
| 5,740,062 A | * 4/1998 | Berken et al. | 364/478.06 |
| 5,811,211 A | 9/1998 | Tanaka et al. | 430/30 |
| 5,905,850 A | * 5/1999 | Kaveh | 395/94 |
| 5,917,601 A | * 6/1999 | Shimazaki et al. | 356/375 |
| 5,980,194 A | 11/1999 | Freerks et al. | |
| 5,988,971 A | 11/1999 | Fossey et al. | |
| 6,013,112 A | 1/2000 | Iizuka et al. | 29/25.01 |
| 6,013,920 A | 1/2000 | Gordon et al. | 250/559.36 |
| 6,021,380 A | 2/2000 | Fredriksen et al. | 702/35 |
| 6,032,083 A | 2/2000 | Oosawa | 700/218 |
| 6,037,733 A | * 3/2000 | Genov et al. | 318/568.11 |
| 6,075,334 A | * 6/2000 | Sagues et al. | 318/568.11 |
| 6,121,743 A | * 9/2000 | Genov et al. | 318/568.11 |
| 6,275,742 B1 | * 8/2001 | Sagues et al. | 700/213 |

* cited by examiner

Primary Examiner—Christopher P. Ellis
Assistant Examiner—Michael Butler
(74) Attorney, Agent, or Firm—Skjerven Morrill MacPherson LLP; Tom Chen

(57) ABSTRACT

Disclosed is a system and method for detecting the position of a wafer with respect to a calibrated reference position. In one embodiment of the invention, sensors are used to detect the edges of the wafer as the wafer is being passed over the sensors. This wafer detection information is then used to calculate the amount by which the wafer is off-centered such that corrections can be made before the wafer is placed onto a destination location.

30 Claims, 12 Drawing Sheets

WAFER CENTERING SYSTEM AND METHOD

CROSS REFERENCE TO RELATED APPLICATION

This application is a continuation in-part of U.S. patent application Ser. No. 09/343,612 filed Jun. 30, 1999, which claims priority from U.S. Provisional Application No. 60/111,803 filed Nov. 17, 1998.

BACKGROUND OF THE INVENTION

1. Field of the Invention

This invention relates to systems and methods for moving semiconductor wafers in a semiconductor manufacturing equipment.

2. Description of the Related Art

Specialized semiconductor manufacturing equipment is used to convert bare silicon wafers into working devices. This semiconductor manufacturing equipment typically has a loading station for placing pre-processed wafers therein, a process module for processing the wafers, and a wafer handling system for moving wafers between the loading station and the process module.

In modern semiconductor manufacturing equipment, the wafer handling system incorporates automated mechanical manipulators or robots. The robot has a paddle or end-effector at the end of its arm for picking up a wafer and placing the wafer at various locations within the semiconductor manufacturing equipment. The robot can automatically perform its wafer handling tasks because the coordinates of various locations within the manufacturing equipment, such as process modules and load locks, are pre-programmed in the robot. To move a wafer from one location to another, for example, the robot can determine its present position by reading various sensors and encoders, recall from its storage memory the pre-programmed coordinates of the destination location, and then move the wafer along a calculated path onto the destination location. There are several factors that affect the robot's ability to accurately move wafers. First, it is critical that the placement/pick-up locations within the manufacturing equipment do not change after the robot is programmed with their coordinates. This is usually not a problem because the modules comprising the manufacturing equipment are fixedly installed onto the factory floor. As long as the equipment's modules are not replaced or moved, the programmed coordinates should remain valid indefinitely. Second, wafer movement within the manufacturing equipment is based on the assumption that the wafer is centered on the robot's paddle as the wafer is moved from one location to another. Unlike the pre-programmed location coordinates, the position of the wafer on the paddle cannot be pre-determined nor assumed. The position of the wafer on the paddle can be shifted due to hand-off variations between paddle pre-programmed coordinates or due to movement in the process module, load lock, or loading station. Off-center wafers can result in wafer breakage and/or wafer misplacement. Thus, it is very important to accurately determine how much the wafer is off-centered such that necessary corrections can be made prior to placing the wafer onto a location.

SUMMARY OF THE INVENTION

The invention provides a system and method for detecting the position of a wafer with respect to a calibrated reference position. In one embodiment of the invention, sensors are used to detect the edges of the wafer as the wafer is passed over the sensors. This edge detection information is then used to calculate the amount by which the wafer deviated from a reference position so that the robot's placement coordinates can be modified to compensate for the deviation before the wafer is placed onto a destination location.

DESCRIPTION OF THE PREFERRED EMBODIMENTS

1. Overview of the Wafer Centering System

Figure 1:
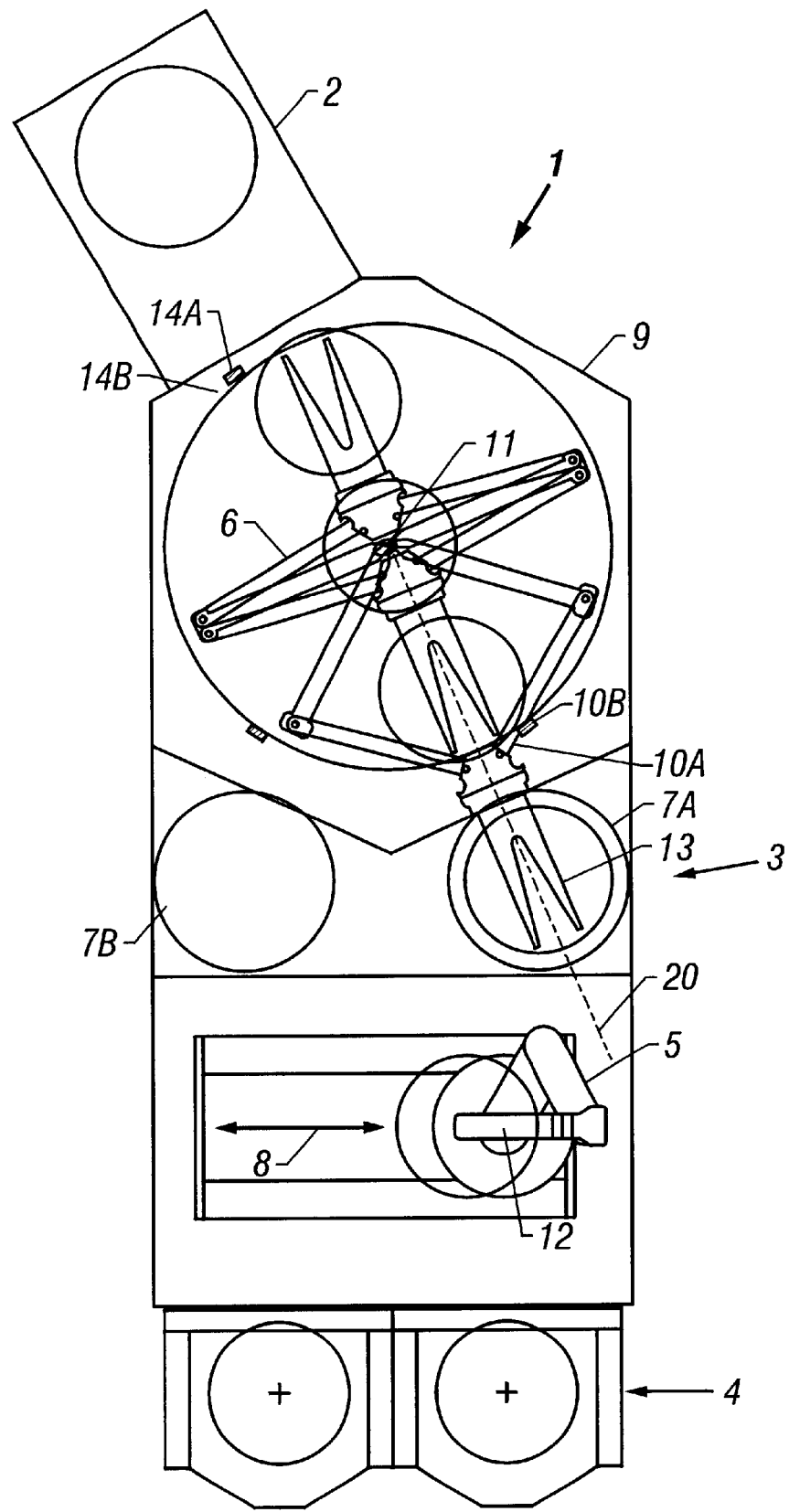
FIG. 1 is a plan view of semiconductor manufacturing equipment employing the present invention.

FIG. 1 shows an example of semiconductor manufacturing equipment that can be used with the present invention. Manufacturing equipment 1 includes a process module 2, a wafer handler 3, and a loading station 4. An example of manufacturing equipment 1 is the model CONCEPT-3™ chemical vapor deposition system from Novellus Systems, Inc. of San Jose, California. Process module 2 is where wafer processing occurs. Manufacturing equipment 1 can accommodate a plurality of process modules but only one is shown for clarity of illustration. By way of example, process module 2 can be a physical vapor deposition, chemical vapor deposition, ashing, or etch reactor.

Pre-processed wafers, typically in a wafer carrier, are manually loaded onto loading station 4. Wafer handler 3 moves pre-processed wafers from loading station 4 and into process module 2 for processing. Similarly, wafer handler 3 moves processed wafers from process module 2 and onto loading station 4.

To automate the movement of wafers within manufacturing equipment 1, wafer handler 3 includes an atmospheric robot 5 and a vacuum robot 6. Atmospheric robot 5 is a conventional 3-axis robot mounted on a fourth translation axis defined by arrows 8. Atmospheric robot 5 has a paddle 12 for supporting a wafer thereon. Using paddle 12, atmospheric robot 5 picks up a wafer from loading station 4 and places the wafer into either a load lock 7A or a load lock 7B, whichever is available. Load locks 7A and 7B are transition chambers between a transfer chamber 9, which is under vacuum, and the rest of the factory which is under atmospheric pressure. After the wafer is placed inside load lock 7A (or load lock 7B), the pressure within load lock 7A is equalized with that of transfer chamber 9. Subsequently, vacuum robot 6 rotates towards load lock 7A to pick up the wafer using a paddle 13. Vacuum robot 6 is a conventional robot that is capable of radial and rotational motion. Vacuum robot 6 has input lines for reading various sensors and output lines for providing the robot's radial (extension) and angular (rotational or theta) positions to an external host processor.

By way of example, vacuum robot 6 can be the MAGNAT-RAN™ Model MAG-7 robot, Part No. 002-1600-02, from Brooks Automation, Inc. of Chelmsford, Mass.

Figure 8:
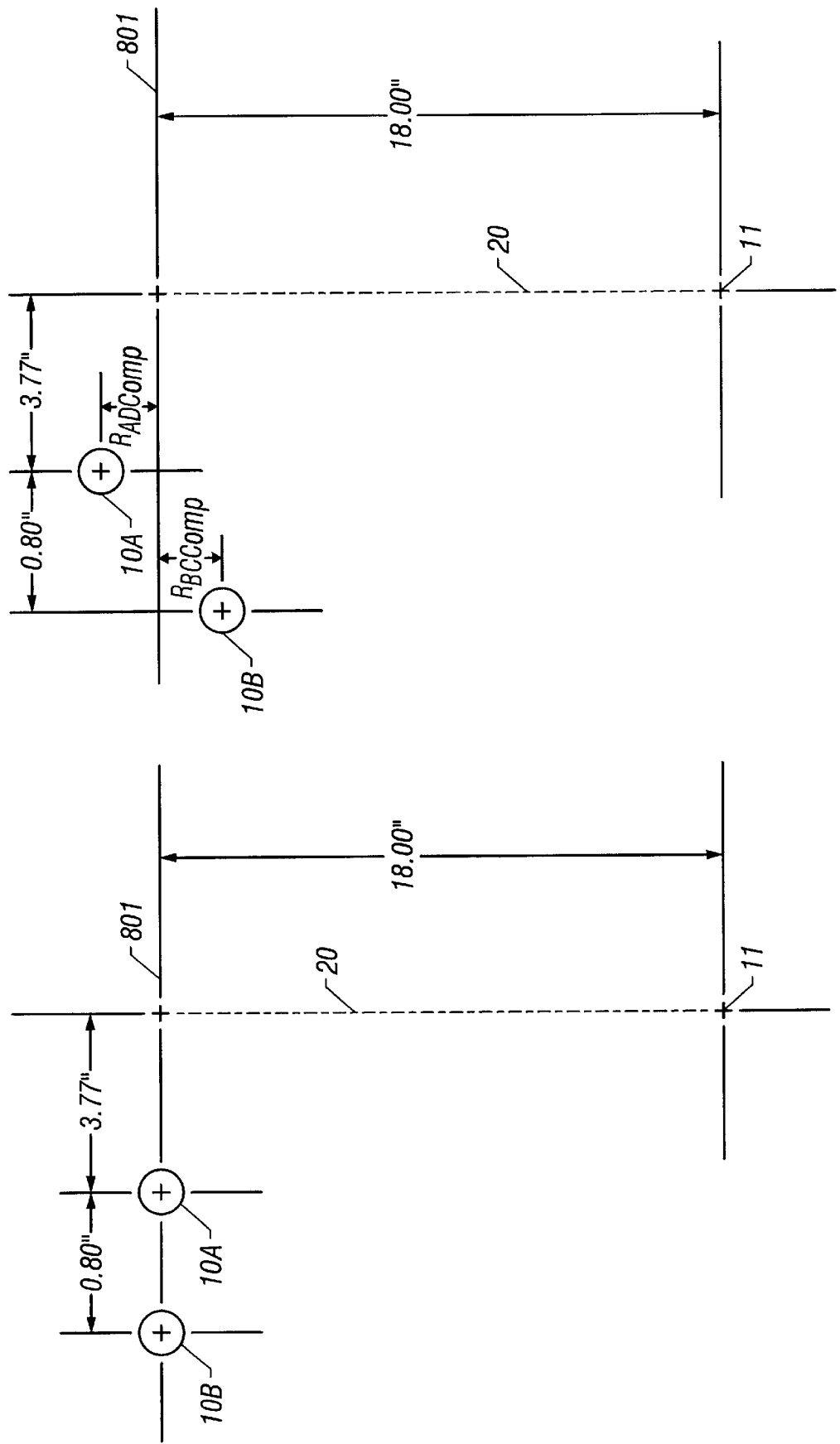
FIG. 8A shows the relative location of a sensor pair in accordance with the present invention.
FIG. 8B shows a misaligned sensor pair.

Once the wafer is picked up from load lock 7A using paddle 13, vacuum robot 6 radially retracts the wafer away from load lock 7A along an imaginary line 20 and towards a rotational axis 11. Imaginary line 20 extends from the center of rotational axis 11 to the center of the pick-up location which, in this particular example, is load lock 7A. Rotational axis 11 is also referred to as the robot center. As the wafer is retracted, the wafer passes over sensors 10A and 10B, thereby triggering vacuum robot 6 to record its radial and angular positions each time an edge of the wafer passes over sensors 10A or 10B. Sensors 10A and 10B are conventional sensors such as the model E3L-2LE4-50 sensors from Omron Electronics, Inc. of Schaumburg, Ill. For manufacturing equipment 1, the mounting locations of sensors 10A and 10B in relation to axis 11 are shown in FIG. 8A. Similar sensor configurations can be made for other locations in manufacturing equipment 1 (e.g. sensors 14A and 14B mounted adjacent to process module 2).

To determine whether the wafer is properly centered on paddle 13, the external host processor reads the wafer edge detection information from robot 6 and then calculates the position of the wafer. If the wafer is not centered and the error is within a correctable range, the external host processor sends control information to vacuum robot 6 such that corrections can be made before the wafer is placed onto process module 2. Otherwise, an alarm is generated to notify an operator that the wafer is not properly centered on paddle 13.

The above example illustrates how the present invention can be used to move a wafer from a load lock and into a process module. It is to be understood that the same or similar methods can be employed in moving a wafer from one process module onto a load lock, in moving a wafer between process modules, and in moving a wafer between the loading station and the load lock.

2. The Sensor Transition Logic

The invention provides for the use of one or more sensors within close proximity of a location within manufacturing equipment 1, such as a process module, a load lock, or a loading station. Although one sensor will yield two points which can be used to determine the center of a circular geometry, there is the possibility that the sensor will intersect a notch of the wafer substrate, leading to an erroneous calculation of the wafer's position on the paddle. Thus, the use of more than one sensor is recommended.

Although the present invention allows for the use of more than two sensors, only the use of two sensors will be illustrated herein in the interest of clarity. As shown in FIG. 2B, the output of sensor 10A, output signal 17, is used as an input to a two-input AND-gate 16. The output of sensor 10B is inverted by inverter gate 15 which output, output signal 18, is presented to an input of AND-gate 16. The output of AND-gate 16, output signal 19, is coupled to a digital input line of robot 6. Robot 6 communicates with a host processor 51 via communications line 50. Host processor 51 can be any conventional computer and may be internal to robot 6. In this particular example, line 50 may be any standard communications line such as RS-232, ethernet, or arcnet.

Figure 2A:
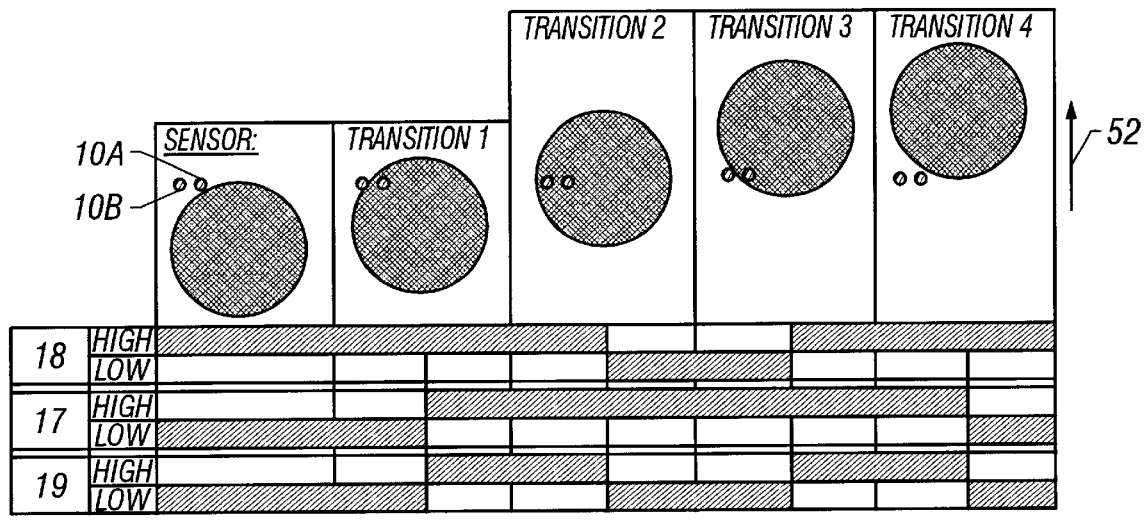
FIGS. 2A and 2B show a logic circuit and timing diagram for a sensor configuration in accordance with the present invention.
Figure 2B:
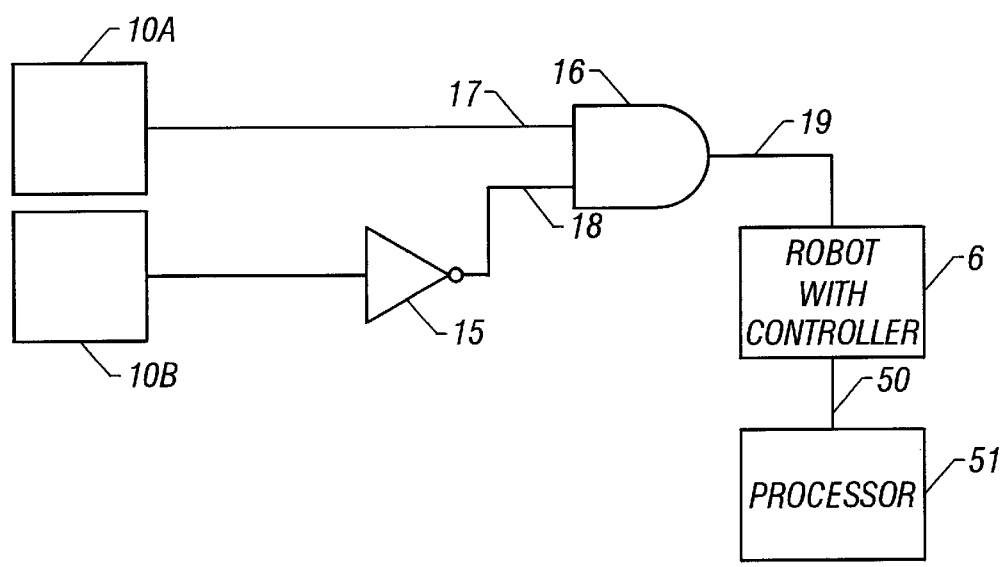

The logic for each state transition with respect to wafer position is shown in FIG. 2A. When sensors 10A and 10B are not blocked by the wafer, both sensors output a logical LOW. Thus signal 18 is at a logical HIGH and signal 17 is at logical LOW, resulting in signal 19 being LOW. As the wafer is retracted from a pick-up point in the direction of arrow 52, the wafer blocks sensor 10A but not 10B. This sensor state condition is referred to as transition 1. Because sensor 10A is blocked during transition 1, signal 17 changes to HIGH which in turn causes signal 19 to go from LOW to HIGH. Signal, 19 going from LOW to HIGH produces an edge which activates vacuum robot 6 to record its present radial and angular position.

As the wafer is further retracted in the direction of arrow 52, both sensors 10A and 10B will be blocked. The sensor state condition following transition 1 and wherein both sensors are blocked is referred to as transition 2. During transition 2, sensors 10A and 10B will output a HIGH resulting in signal 17 remaining HIGH (the same as in transition 1) and signal 18 changing from HIGH to LOW. This in turn causes signal 19 to change from HIGH to LOW. Vacuum robot 6 detects signal 19's changing state and correspondingly records its present radial and angular position. Two more transitions occur as the wafer is retracted in the direction of arrow 52. Transition 2 is immediately followed by transition 3 which is subsequently followed by transition 4. As is evident from FIG. 2A, signal 19 changes logical state once per transition. Robot 6 records its radial and angular position at each instance of signal 19's state change. Because sensors 10A and 10B provide 4 transitions during a wafer retract, robot 6 will have four radial and angular data for wafer centerpoint calculations which will be described later below.

Figure 12:
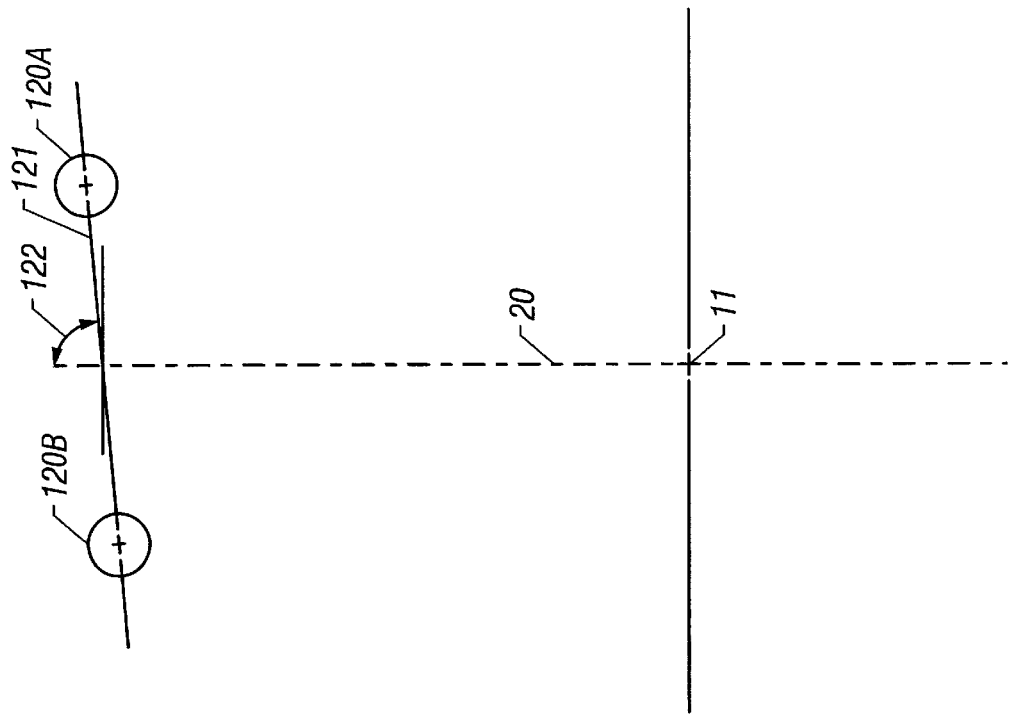
FIG. 12 shows a sensor configuration in accordance with the present invention.

The sensor transition logic described herein can also be used in conjunction with sensor configurations other than that shown in FIG. 8A. For example, FIG. 12 shows sensors 120A and 120B mounted on both sides of line 20 along an offset line 121. Line 121 forms an acute angle 122 with line 20. By positioning sensors 120A and 120B such that they are offset, said sensors can be triggered one at a time in a manner similar to sensors 10A and 10B.

3. Calculation of Calibrated Reference Values

A calibrated reference position, or the position of a wafer ideally centered on paddle 13 relative to sensors 10A and 10B, needs to be defined for future comparison purposes. Using a test wafer which is manually and fixedly mounted on the center of paddle 13, robot 6 is commanded to retract the test wafer from a module "n" times to obtain an averaged data set. Care must be taken such that the notch of the test wafer is not passed over the sensors. For each pass, the four radial positions of robot 6, $R_1$–$R_4$, corresponding to the four sensor transitions which occur as the wafer is passed across sensors 10A and 10B, are read from robot 6 by processor 51 (FIG. 2B). $R_1$ corresponds to the radial position of robot 6 as the wafer passes over the sensors during transition 1. Because transition 1 is the first transition during the retract and because radial positions are measured relative to the robot's rotational axis 11, $R_1$ will have the largest value of the four radial positions. Similarly $R_2$, $R_3$, and $R_4$ will have decreasing values because they correspond to the radial positions of robot 6 during transitions 2, 3, and 4 respectively. $R_4$, the robot radial position in transition 4, will have the smallest value of the four radial positions because robot 6 is closer to rotational axis 11 in transition 4 than in any other transitions.

Figure 3:
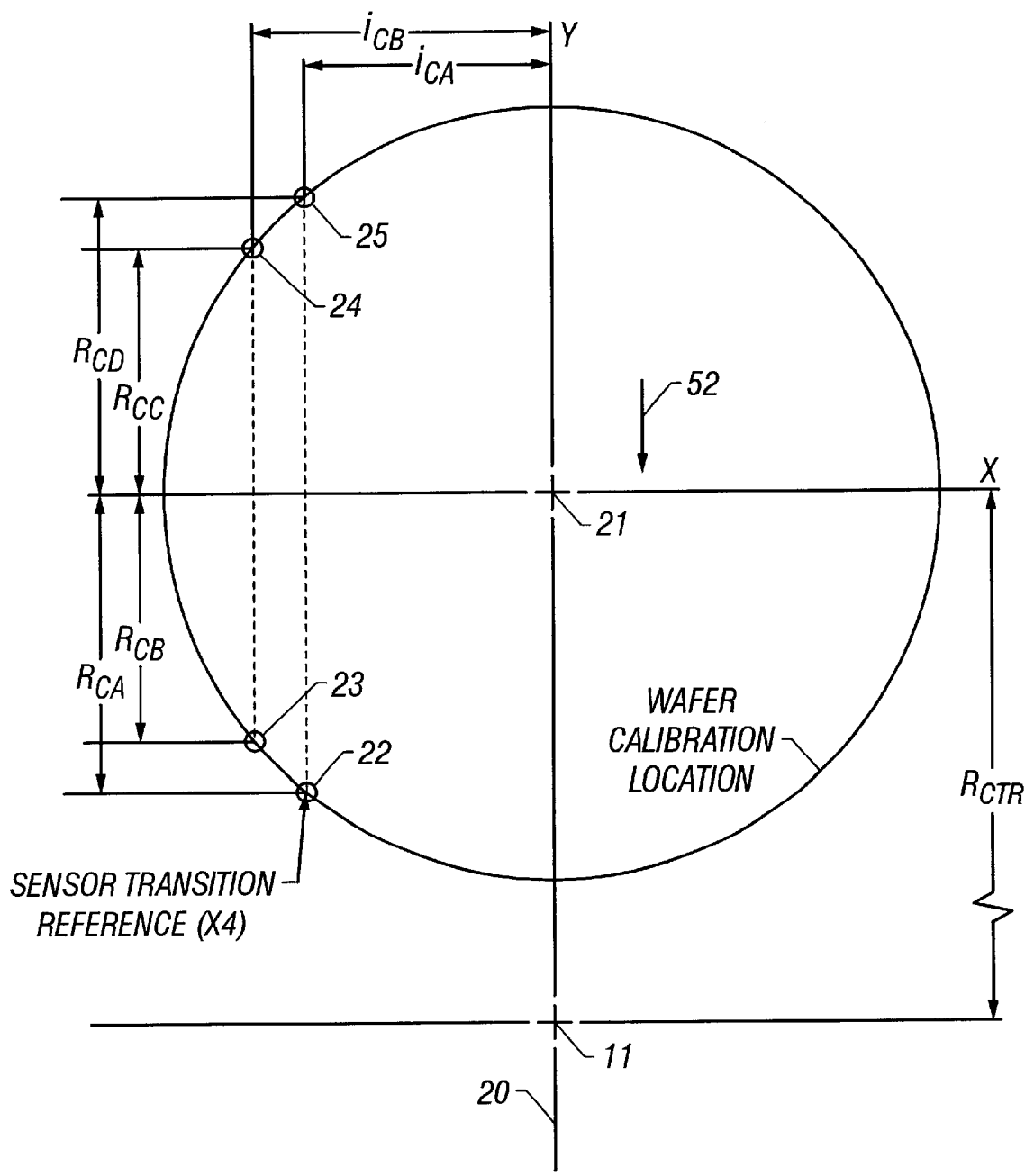
FIGS. 3, 4, 5A, 5B, 9, 10, and 11 show the geometric definitions of various parameters used for calculations in accordance with the present invention.

As shown in FIG. 3, the radial location of a calibrated center 21 relative to axis 11 is defined as, $$R_{CTR} = \frac{\sum_{k=1}^{n}(R_1 + R_2 + R_3 + R_4)_k}{4n} \quad \text{(Eq. 1)}$$

As previously discussed, the four radial positions correspond to four points on the wafer's edge which triggered transitions 1–4. In FIG. 3, calibrated point 22 is the edge of the wafer which passed over sensor 10A to trigger transition 1. Similarly calibrated points 23, 24, and 25 are edges of the wafer which passed over the sensors to trigger transitions 2, 3, and 4 respectively. Because $R_{CTR}$ is an average of the four radial positions, there will be two points in the positive "Y" direction and two points in the negative "Y" direction with respect to calibrated center 21. Point 22 is closest to axis 11 and must therefore be related to the smallest radial position ($R_4$). Thus, calibrated position $R_{CA}$, defined in FIG. 3, equals, $$R_{CA} = \frac{\sum_{k=1}^{n}(R_4)_k}{n} - R_{CTR} \quad \text{(Eq. 2A)}$$

Eq. 2A is based on the assumption that a line intersecting sensors 10A and 10B (FIG. 8A, line 801) is orthogonal to the robot's retract path (FIG. 8A, line 20). If this is not the case, Eq. 2B (shown below) is used instead of Eq. 2A to compensate for sensor mounting and alignment errors such as the error illustrated in FIG. 8B.

$$R_{CA} = \frac{\sum_{k=1}^{n}(R_4)_k}{n} - R_{CTR} - R_{ADComp} \quad \text{(Eq. 2B)}$$

$R_{ADComp}$, shown in FIG. 8B, compensates for slight sensor mounting and alignment errors. $R_{ADComp}$ is found by calculating the difference between $R_{CTR}$ and the average of sensor transitions 1 and 4 which are the two transitions associated with sensor 10A.

$$R_{ADComp} = \frac{\frac{\sum_{k=1}^{n}(R_1)_k}{n} + \frac{\sum_{k=1}^{n}(R_4)_k}{n}}{2} - R_{CTR} \quad \text{(Eq. 2C)}$$

Likewise, $R_{BCComp}$ is found by calculating the difference between $R_{CTR}$ and the average of the robot's radial position during transitions 2 and 3, which are the two transitions associated with sensor 10B.

$$R_{BCComp} = \frac{\frac{\sum_{k=1}^{n}(R_2)_k}{n} + \frac{\sum_{k=1}^{n}(R_3)_k}{n}}{2} - R_{CTR} \quad \text{(Eq. 2D)}$$

Calibrated positions $R_{CB}$, $R_{CC}$, and $R_{CD}$ are similarly found. For example, because point 25 (FIG. 3) is farthest from axis 11, $R_{CD}$ must be equal to the largest robot radial position, $R_1$, minus $R_{CTR}$. Eqs. 3–5 provide the equations for finding calibrated positions $R_{CB}$, $R_{CC}$, and $R_{CD}$:

$$R_{CB} = \frac{\sum_{k=1}^{n}(R_3)_k}{n} - R_{CTR} - R_{BCComp} \quad \text{(Eq. 3)}$$

$$R_{CC} = \frac{\sum_{k=1}^{n}(R_2)_k}{n} - R_{CTR} - R_{BCComp} \quad \text{(Eq. 4)}$$

$$R_{CD} = \frac{\sum_{k=1}^{n}(R_1)_k}{n} - R_{CTR} - R_{ADComp} \quad \text{(Eq. 5)}$$

where $R_{ADComp}$ and $R_{BCComp}$ are found using Eqs. 2C and 2D.

Calibrated position $i_{CA}$, shown in FIG. 3, is the distance of sensor 10A relative to line 20. Using the radius of the wafer, $R_{wafer}$, as the hypotenuse and $R_{CA}$ and $R_{CD}$ as legs of two right triangles, the pythagorean theorem and averaging yield $i_{CA}$ as shown in Eq. 6 below. Eq. 7 provides the corresponding equation for $i_{CB}$, the distance of sensor 10B relative to line 20.

$$i_{CA} = \frac{[R_{wafer}^2 - R_{CA}^2]^{\frac{1}{2}} + [R_{wafer}^2 - R_{CD}^2]^{\frac{1}{2}}}{2} \quad \text{(Eq. 6)}$$

$$i_{CB} = \frac{[R_{wafer}^2 - R_{CB}^2]^{\frac{1}{2}} + [R_{wafer}^2 - R_{CC}^2]^{\frac{1}{2}}}{2} \quad \text{(Eq. 7)}$$

Eqs. 1, 2A–2D, and 3–7 define a set of calibrated reference data which are used for comparison purposes during normal operation. The calibrated reference data are stored in memory and only need to be recalculated whenever a location or robot of the semiconductor manufacturing equipment is replaced or moved.

Figure 4:
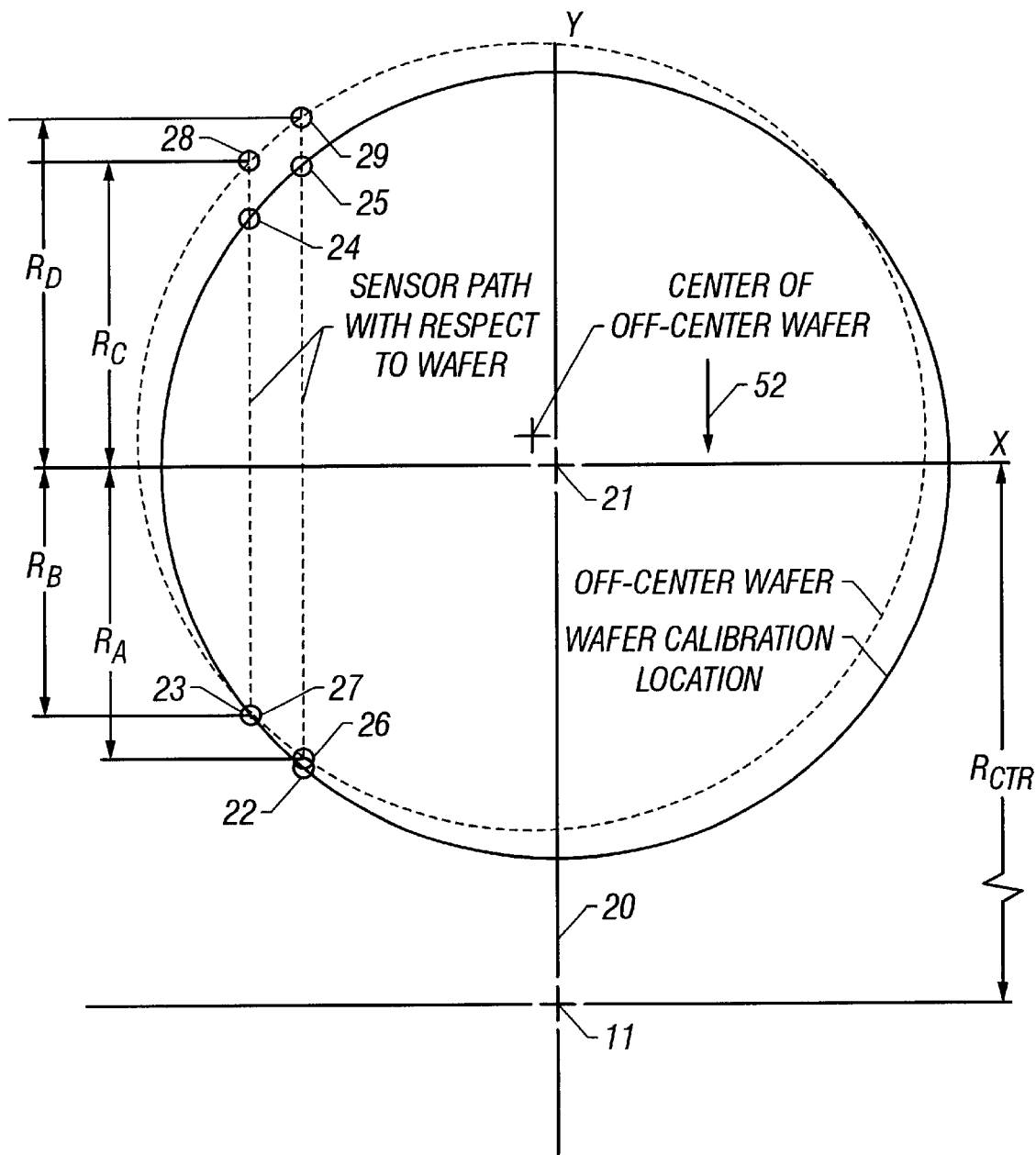

4. Comparing The Measured Sensor Transition Data With The Calibrated Reference Data During normal operation, the wafer's actual center may not coincide with calibrated center 21 (i.e. the wafer is off-centered). This will result in measured sensor transition data deviating from the calibrated reference data. To determine this deviation, the radial position of robot 6 for transitions 1–4, which are defined as $r_1$–$r_4$, respectively, are read from robot 6 as the wafer is retracted from a location. Measured transition data, $R_A$–$R_D$, are defined in FIG. 4 and calculated using $r_1$–$r_4$, as follows:

$$R_A = r_4 - R_{CTR} - R_{ADComp} \quad \text{(Eq. 8)}$$

$$R_B = r_3 - R_{CTR} - R_{BCComp} \quad \text{(Eq. 9)}$$

$$R_C = r_2 - R_{CTR} - R_{BCComp} \quad \text{(Eq. 10)}$$

$$R_D = r_1 - R_{CTR} - R_{ADComp} \quad \text{(Eq. 11)}$$

Figure 5A:
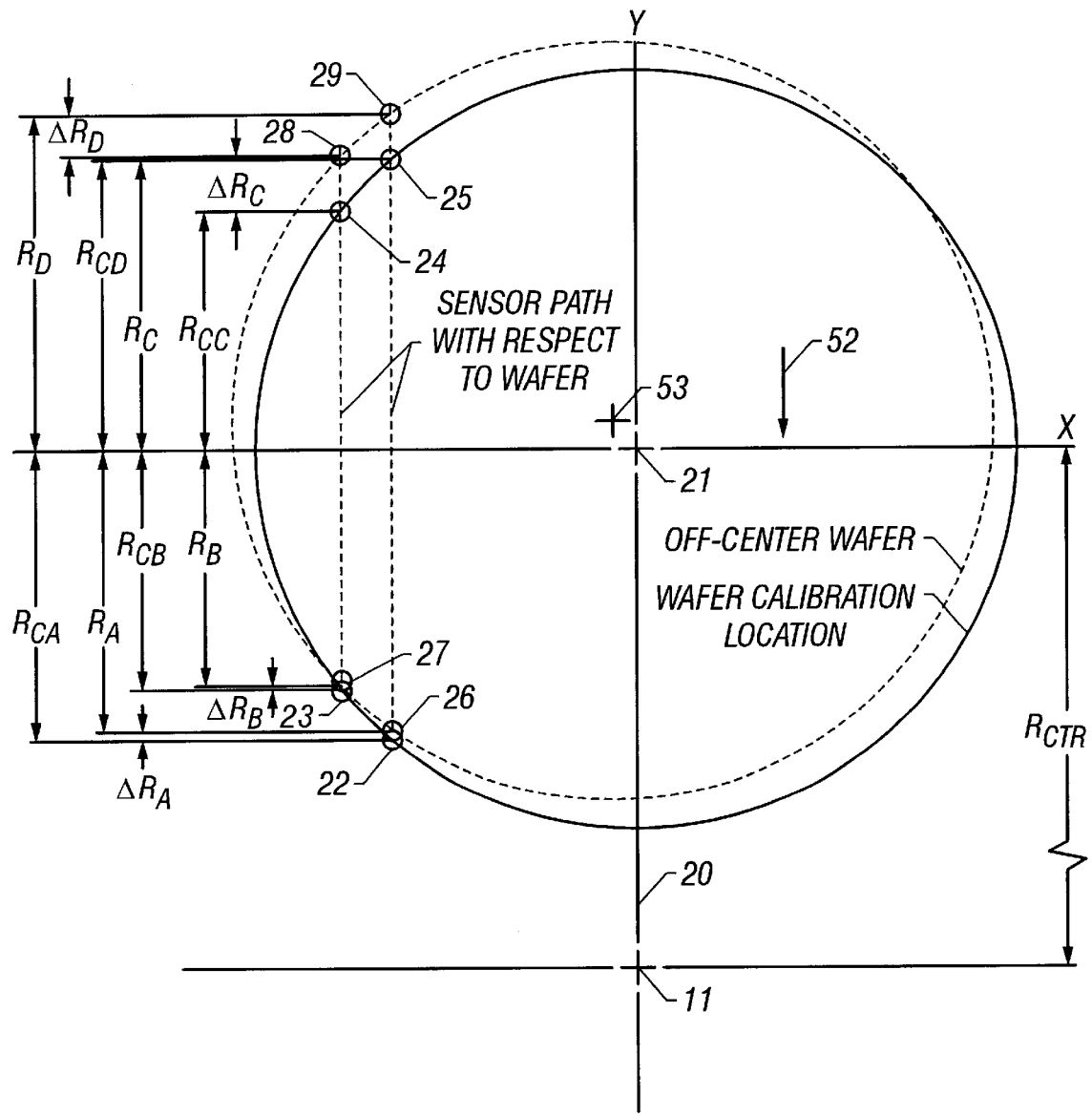

In FIG. 5A, measured points 26–29 are edges of the off-centered wafer which passed over the sensors to trigger transitions 1–4, respectively, during retract of the wafer. Because measured transition data are measured relative to $R_{CTR}$, they can be directly compared with the calibrated reference data using Eqs. 12–15 shown below.

$$\Delta R_A = R_A - R_{CA} \quad \text{(Eq. 12)}$$

$$\Delta R_B = R_B - R_{CB} \quad \text{(Eq. 13)}$$

$$\Delta R_C = R_C - R_{CC} \quad \text{(Eq. 14)}$$

$$\Delta R_D = R_D - R_{CD} \quad \text{(Eq. 15)}$$

5. Wafer Centerpoint Calculation

The results obtained by comparing the measured sensor transition data with the calibrated reference data can be used to determine the centerpoint of the off-centered wafer.

Figure 5B:
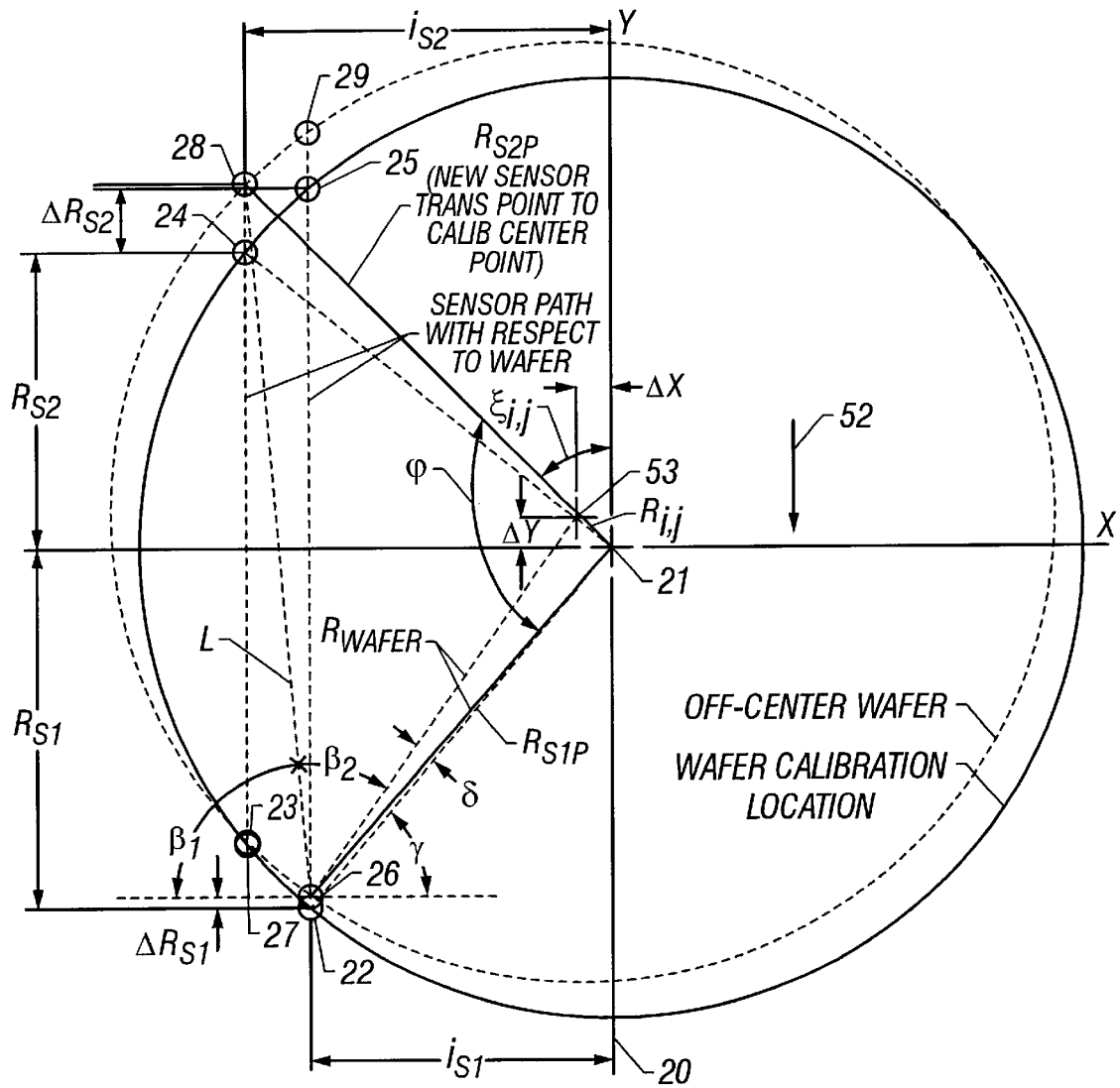

Two sensor transition points can be used to calculate the center of the off-centered wafer. In FIG. 5B, center 53 of the off-centered wafer is calculated using transition 1 and transition 3 as an example. As previously discussed, transition 1 corresponds to point 22 for the calibrated wafer and point 26 for the measured wafer, while transition 3 corresponds to point 24 for the calibrated wafer and point 28 for the measured wafer. In FIG. 5B, $R_{S1}$ is the radial distance from calibrated center 21 to calibrated point 22. From FIG. 5A, it can be seen that $S_{S1}$ is equal to $R_{CA}$. $\Delta R_{S1}$, the radial distance between calibrated point 22 and measured point 26, can be determined from FIG. 5A as equal to $\Delta R_A$. Because robot 6 retracts the wafer along line 20, a fixed path, $i_{S1}$ is simply the distance between line 20 and sensor 10A, the sensor which corresponds to transition 1. Thus, from FIG. 3, $i_{S1}$ is equal to $i_{CA}$. The magnitude of a vector from calibrated center 21 to measured point 26 is $R_{S1P}$. Using the pythagorean theorem, $R_{S1P}$ is obtained from $R_{S1}$, $\Delta R_{S1}$, and $i_{S1}$ as follows, $$R_{S1P}=[(S_{S1}+\Delta R_{S1})^2+i_{S1}^2]^{1/2} \quad (Eq. 16)$$

$R_{S2P}$, the magnitude of a vector from calibrated center 21 to measured point 28, can be similarly obtained by finding $R_{S2}$, $\Delta R_{S2}$, and $i_{S2}$.

$$R_{S2P}=[(S_{S2}+\Delta R_{S2})^2+i_{S2}^2]^{1/2} \quad (Eq. 17)$$

From the geometric relationships shown in FIG. 5B, the distance between measured points 26 and 28, L, is calculated using the pythagorean theorem as follows:

$$L=[(R_{S2}+\Delta R_{S2}-R_{S1}-\Delta R_{S1})^2+(i_{S2}-i_{S1})^2]^{1/2} \quad (Eq. 18)$$

Using the values obtained for $R_{S1P}$, $R_{S2P}$, $i_{S1}$, $i_{S2}$, L, and the wafer radius $R_{wafer}$, the angular relationships shown in FIG. 5B can be found as follows, $$\beta_1 = 90 - \tan^{-1}\left[\frac{(i_{S2}-i_{S1})}{R_{S2}+\Delta R_{S2}-R_{S1}-\Delta R_{S1}}\right] \quad (Eq. 19)$$

$$\beta_2 = \cos^{-1}\left[\frac{L^2}{2LR_{wafer}}\right] \quad (Eq. 20)$$

$$\gamma = \cos^{-1}\left(\left|\frac{i_{S1}}{R_{S1P}}\right|\right) \quad (Eq. 21)$$

$$\delta=180-\gamma-\beta_1-\beta_2 \quad (Eq. 22)$$

$R_{i,j}$, the magnitude of the vector extending from calibrated center 21 to center 53, can be calculated using the law of cosines.

$$R_{i,j}=[R_{S1P}^2+R_{wafer}^2-2R_{S1P}R_{wafer}\cos(\delta)]^{1/2} \quad (Eq. 23)$$

As shown in FIG. 5B, $\xi_{i,j}$ is the angle of a vector from calibrated center 21 to center 53 of the off-centered wafer. $\xi_{i,j}$ is given by Eq. 25 below.

$$\varphi = \cos^{-1}\left(\frac{R_{wafer}^2-R_{S1P}^2-R_{i,j}^2}{-2R_{S1P}R_{i,j}}\right) \quad (Eq. 24)$$

$$\xi_{i,j}=90+\gamma-\phi \quad (Eq. 25)$$

Thus, $$\Delta X=R_{i,j}\cos(\xi_{i,j}) \quad (Eq. 26)$$

$$\Delta Y=R_{i,j}\sin(\xi_{i,j}) \quad (Eq. 27)$$

Eqs. 23 and 25 ($R_{i,j}$ and $\xi_{i,j}$) represent the deviation of the actual wafer center from that of the calibrated reference for the sensor pair under evaluation. $\xi_{i,j}$ is the angular deviation while $R_{i,j}$ is the radial deviation. For the wafer center calculation using transition 1 and transition 3, $R_{i,j}$ and $\xi_{i,j}$ are written as $R_{1,3}$ and $\xi_{1,3}$.

In the foregoing example, the centerpoint of the off-centered wafer was calculated using the sensor transition pair transition 1 and transition 3. As shown in FIG. 2A, using two sensors provides four sensor transitions. This, in turn, yields six possible sensor transition pairs: (1,2), (1,3), (1,4), (2,3), (2,4), and (3,4) wherein (1,2) refers to the pair (transition 1, transition 2) etc. The wafer's actual center can be determined for each sensor transition pair. Because there are six possible transition pairs in this particular embodiment, six wafer centerpoints may be calculated.

By making appropriate input variable substitutions, Eqs. 16–27 can be used to calculate the center of the off-centered wafer using transition pairs other than sensor transition pair (1,3). Further, as is evident to one of ordinary skill in the art, the same principle can be used to calculate wafer centerpoints when using more than two sensors. To calculate the wafer center using other sensor transition pairs, the values for input variables $\Delta R_{S1}$, $\Delta R_{S2}$, $R_{S1}$, $R_{S2}$, $i_{S1}$, and $i_{S2}$ (FIG. 5B) need to be determined. By following the same methodology used in determining the values of the input variables for sensor transition pair (1,3), the center of the off-centered wafer can be calculated using Eqs. 16–27. Table 1 summarizes the value of each input variable for each sensor transition pair.

TABLE 1

|  | (1,2) | (1,3) | (1,4) | (2,3) | (2,4) | (3,4) |
| --- | --- | --- | --- | --- | --- | --- |
| $\Delta R_{S1}$ | $\Delta R_A$ | $\Delta R_A$ | $\Delta R_A$ | $\Delta R_B$ | $\Delta R_B$ | $\Delta R_B$ |
| $\Delta R_{S2}$ | $\Delta R_B$ | $\Delta R_C$ | $\Delta R_D$ | $\Delta R_C$ | $\Delta R_D$ | $\Delta R_A$ |
| $R_{S1}$ | $R_{CA}$ | $R_{CA}$ | $R_{CA}$ | $R_{CB}$ | $R_{CB}$ | $R_{CB}$ |
| $R_{S2}$ | $R_{CB}$ | $R_{CC}$ | $R_{CD}$ | $R_{CC}$ | $R_{CD}$ | $R_{CA}$ |
| $i_{S1}$ | $i_{CA}$ | $i_{CA}$ | $i_{CA}$ | $i_{CB}$ | $i_{CB}$ | $i_{CA}$ |
| $i_{S2}$ | $i_{CB}$ | $i_{CB}$ | $i_{CA}$ | $i_{CB}$ | $i_{CA}$ | $i_{CB}$ |

In calculating the wafer centerpoint for sensor transition pair (2,4), for example, Eqs. 16–27 are used with the following input variable values:

$$\Delta R_{S1}=\Delta R_B$$

$$\Delta R_{S2}=\Delta R_D$$

$$R_{S1}=R_{CB}$$

$$R_{S2}=R_{CD}$$

$$i_{S1}=i_{CB}$$

$$i_{S2}=i_{CA}$$

The foregoing wafer centerpoint calculation can be performed for all six sensor transition pairs to generate six wafer centerpoints. It is preferable to calculate more than one centerpoint so that the effect of the wafer's notch can be filtered out using, for example, the method described below.

6. Selecting The Best Centerpoints

From the six wafer centerpoints found, the three most closely matched centerpoints are selected. The process of finding the three best centerpoints filters out any potentially bad data and the effect of the wafer's notch on sensor transition. Typically, the wafer's notch will spread three of the centerpoints away from what normally would have been a tight grouping of six centerpoints. The three remaining centerpoints will typically be closer together than the three deviated by the notch. Of course, this deviation is dependent upon how deep into the notch the sensor crosses. Averaging all the centerpoints is not recommended because that would average in the notch, thereby adversely affecting the accuracy of the centerpoint calculation.

The best three centerpoints can be mathematically found using any conventional method without impacting the invention. The best three centerpoints may be found as follows:

STEP 1: Find the distance from each centerpoint to each of the other five centerpoints. In this example, the six centerpoints found are defined as:

$C_{1,2}$
$C_{1,3}$
$C_{1,4}$
$C_{2,3}$
$C_{2,4}$
$C_{3,4}$

Where in the notation $C_{i,j}$, and j refer to the valid sensor transitions 1 through 4. Using the corresponding $R_{i,j}$ and $\xi_{i,j}$ (i.e. radius $R_{i,j}$, and angle $\xi_{i,j}$) values for each centerpoint $C_{i,j}$, distance "D" between any two centerpoints may be found using the following equation:

$$D = \sqrt{(R_{i,j}\sin(\xi_{i,j}) - R_{k,l}\sin(\xi_{k,l}))^2 + (R_{i,j}\cos(\xi_{i,j}) - R_{k,l}\cos(\xi_{k,l}))^2}$$

where $R_{i,j}$ and $\xi_{i,j}$ are the radial and angular values of one centerpoint while $R_{k,l}$ and $\xi_{k,l}$ are the radial and angular values for another centerpoint. As an example, the distance "$D_a$" between centerpoints $C_{1,2}$ and $C_{1,3}$ is:

$$D_a = \sqrt{(R_{1,2}\sin(\xi_{1,2}) - R_{1,3}\sin(\xi_{1,3}))^2 + (R_{1,2}\cos(\xi_{1,2}) - R_{1,3}\cos(\xi_{1,3}))^2}$$

In this example the distances between centerpoints are defined as, $D_a$=distance from $C_{1,2}$ to $C_{1,3}$
$D_b$=distance from $C_{1,2}$ to $C_{1,4}$
$D_c$=distance from $C_{1,2}$ to $C_{2,3}$
$D_d$=distance from $C_{1,2}$ to $C_{2,4}$
$D_e$=distance from $C_{1,2}$ to $C_{3,4}$
$D_f$=distance from $C_{1,3}$ to $C_{1,4}$
$D_g$=distance from $C_{1,3}$ to $C_{2,3}$
$D_h$=distance from $C_{1,3}$ to $C_{2,4}$
$D_i$=distance from $C_{1,3}$ to $C_{3,4}$
$D_j$=distance from $C_{1,4}$ to $C_{2,3}$
$D_k$=distance from $C_{1,4}$ to $C_{2,4}$
$D_l$=distance from $C_{1,4}$ to $C_{3,4}$
$D_m$=distance from $C_{2,3}$ to $C_{2,4}$
$D_n$=distance from $C_{2,3}$ to $C_{3,4}$
$D_o$=distance from $C_{2,4}$ to $C_{3,4}$ STEP 2: Arrange the centerpoints into groups of three and sum (i.e. total) the distances between the three centerpoints. The possible subsets of three centerpoints and their corresponding total distances, $D_1$ to $D_{20}$, for this example are:

1. $C_{1,2}$, $C_{1,3}$, $C_{1,4}$  $D_1=D_a+D_b+D_f$
2. $C_{1,2}$, $C_{1,3}$, $C_{2,3}$  $D_2=D_a+D_c+D_g$
3. $C_{1,2}$, $C_{1,3}$, $C_{2,4}$  $D_3=D_a+D_d+D_h$
4. $C_{1,2}$, $C_{1,3}$, $C_{3,4}$  $D_4=D_a+D_e+D_i$
5. $C_{1,2}$, $C_{1,4}$, $C_{2,3}$  $D_5=D_b+D_j+D_c$
6. $C_{1,2}$, $C_{1,4}$, $C_{2,4}$  $D_6=D_b+D_k+D_d$
7. $C_{1,2}$, $C_{1,4}$, $C_{3,4}$  $D_7=D_b+D_l+D_e$
8. $C_{1,2}$, $C_{2,3}$, $C_{2,4}$  $D_8=D_c+D_m+D_d$
9. $C_{1,2}$, $C_{2,3}$, $C_{3,4}$  $D_9=D_c+D_n+D_e$
10. $C_{1,2}$, $C_{2,4}$, $C_{3,4}$  $D_{10}=D_d+D_o+D_e$
11. $C_{1,3}$, $C_{1,4}$, $C_{2,3}$  $D_{11}=D_f+D_j+D_g$
12. $C_{1,3}$, $C_{1,4}$, $C_{2,4}$  $D_{12}=D_f+D_k+D_h$
13. $C_{1,3}$, $C_{1,4}$, $C_{3,4}$  $D_{13}=D_f+D_l+D_i$
14. $C_{1,3}$, $C_{2,3}$, $C_{2,4}$  $D_{14}=D_g+D_m+D_h$
15. $C_{1,3}$, $C_{2,3}$, $C_{3,4}$  $D_{15}=D_g+D_n+D_i$
16. $C_{1,3}$, $C_{2,4}$, $C_{3,4}$  $D_{16}=D_h+D_o+D_i$
17. $C_{1,4}$, $C_{2,3}$, $C_{2,4}$  $D_{17}=D_j+D_m+D_k$
18. $C_{1,4}$, $C_{2,3}$, $C_{3,4}$  $D_{18}=D_j+D_n+D_l$
19. $C_{1,4}$, $C_{2,4}$, $C_{3,4}$  $D_{19}=D_k+D_o+D_l$
20. $C_{2,3}$, $C_{2,4}$, $C_{3,4}$  $D_{20}=D_m+D_o+D_n$

STEP 3: Select the group of three centerpoints with the smallest total distance as calculated in step 2 (i.e. the smallest of $D_1$ through $D_{20}$). For example, if $D_{17}$ is the smallest of $D_1$ through $D_{20}$, $C_{1,4}$, $C_{2,3}$, and $C_{2,4}$ are selected as the best three centerpoints.

The best three wafer centerpoints are vectors with magnitude and direction (radius $R_{i,j}$, and angle $\xi_{i,j}$). These vectors are decomposed into their rectangular components and averaged together to yield the "net" centerpoint deviation, $\Delta X_{net}$ and $\Delta Y_{net}$.

7. Calculating New Wafer Put Coordinates

Using the net deviation $\Delta X_{net}$ and $\Delta Y_{net}$, the coordinates of the location where the robot will place the wafer ("wafer put coordinates") can be modified to compensate for the deviation. In other words, the $\Delta X_{net}$ and $\Delta Y_{net}$ values can be applied to the existing robot radial and angular coordinates, $R_{PUT}$ and $T_{PUT}$, to modify the wafer put coordinates such that the wafer will be correctly placed at its final location.

Figure 11:
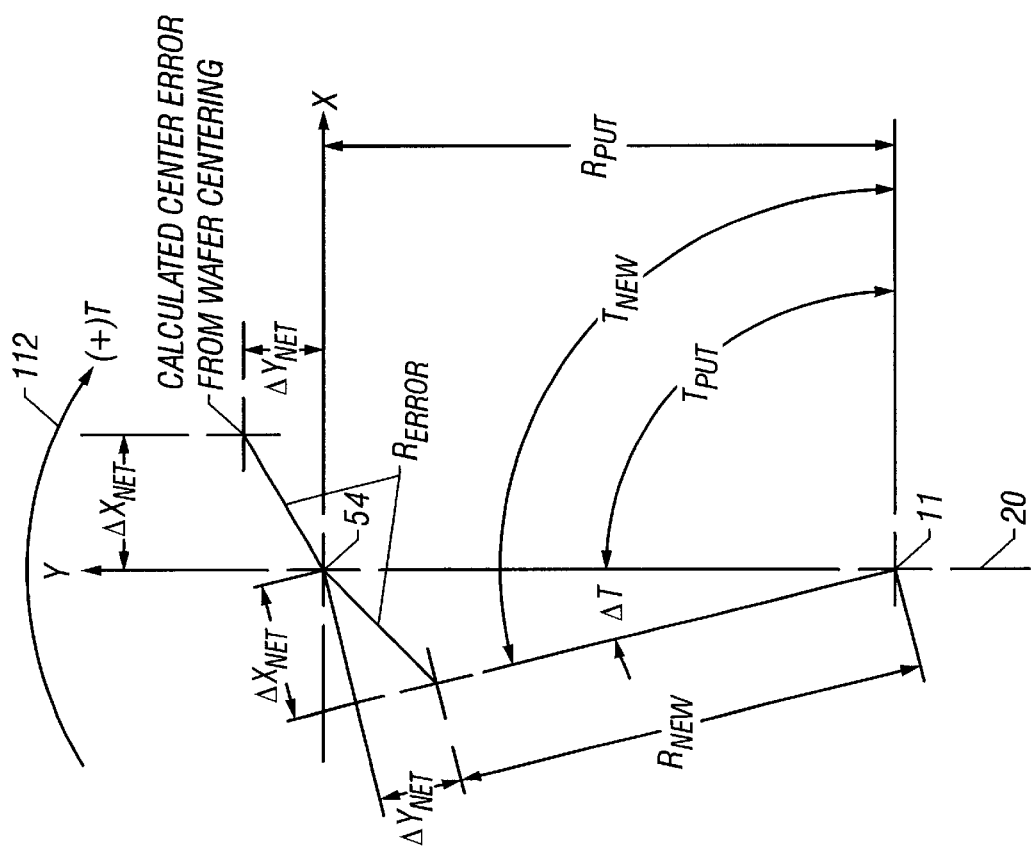

FIG. 11 illustrates how the robot's wafer put coordinates are modified to compensate for the off-centered wafer. As shown in FIG. 11, the wafer centering calculation yielded the centerpoint of the wafer as deviating from wafer put coordinate center 54 by $\Delta X_{net}$ in the X-axis and $\Delta Y_{net}$ in the Y-axis. From FIG. 11, the new radial put coordinate $R_{NEW}$ and the new angular put coordinate $T_{NEW}$ may be determined using right triangle geometry as follows:

$$R_{NEW} = -\Delta Y_{NET} + \sqrt{R_{PUT}^2 - \Delta X_{NET}^2} \qquad \text{(Eq. 28)}$$

$$\Delta T = -a\tan\left(\frac{\Delta X_{NET}}{R_{PUT} + \Delta Y_{NET}}\right)$$

$$T_{NEW} = \Delta T + T_{PUT} \qquad \text{(Eq. 29)}$$

8. Calculating the Wafer's True Radius

In the above examples, the wafer's radius is assumed to be the wafer's nominal radius. However, the wafer's actual or true radius can vary by as much as ±200 µm. For improved accuracy, it is desirable to determine and use the wafer's true radius in calculating the wafer's centerpoint.

Figure 9:
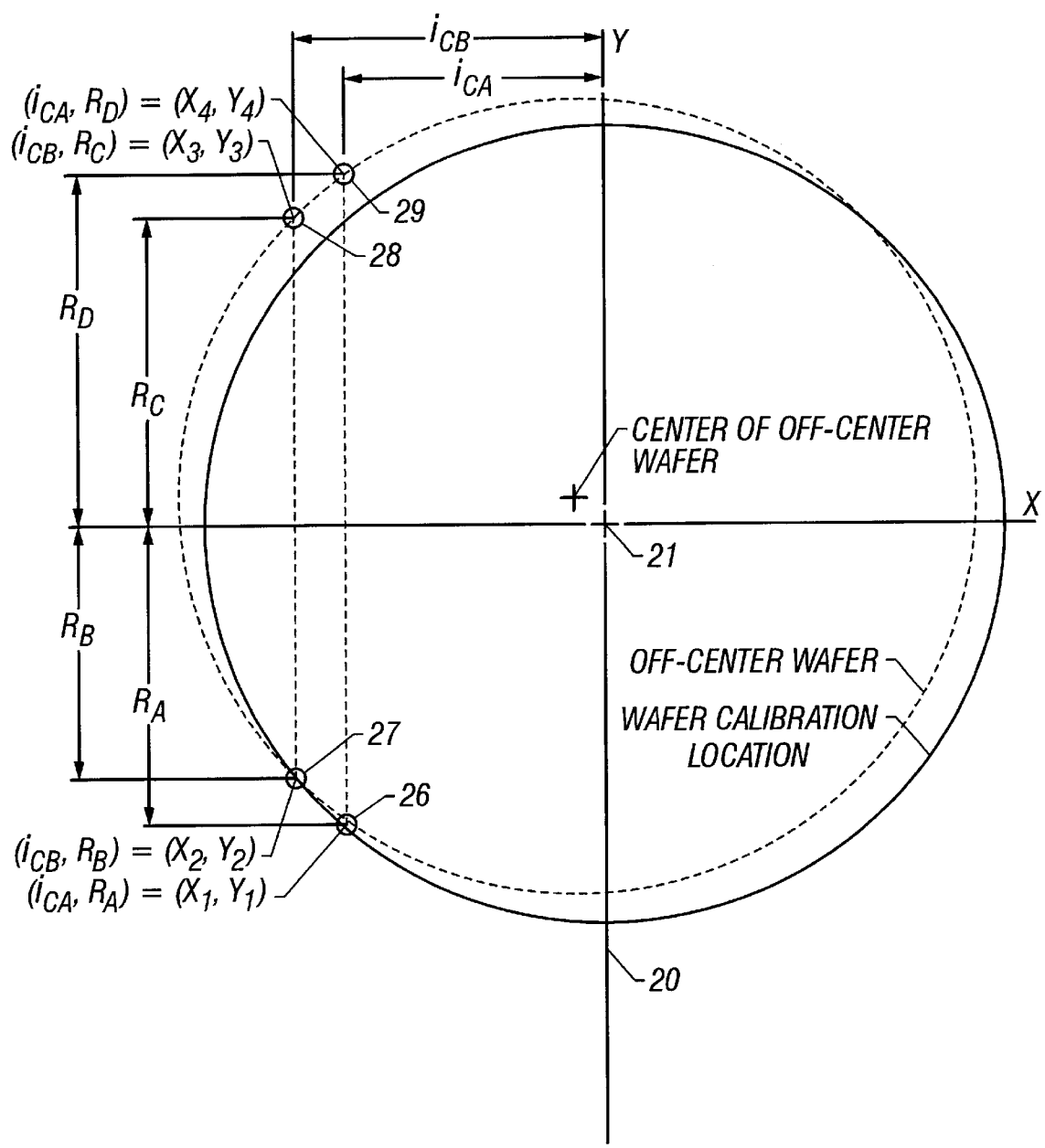

As shown in FIG. 9, points 26–29, which correspond to sensor transitions 1–4, respectively, of the off-centered wafer can be represented as follows:

point 26=$(i_{CA}, R_A)=(x_1, Y_1)$
point 27=$(i_{CB}, R_B)=(X_2, Y_2)$
point 28=$(i_{CB}, R_C)=(X_3, Y_3)$
point 29=$(i_{CA}, R_D)=(X_4, Y_4)$
where,
- $(X_1, Y_1)$ is the x-y coordinate of point 26,
- $(X_2, Y_2)$ is the x-y coordinate of point 27,
- $(X_3, Y_3)$ is the x-y coordinate of point 28, and
- $(X_4, Y_4)$ is the x-y coordinate of point 29.

Figure 10:
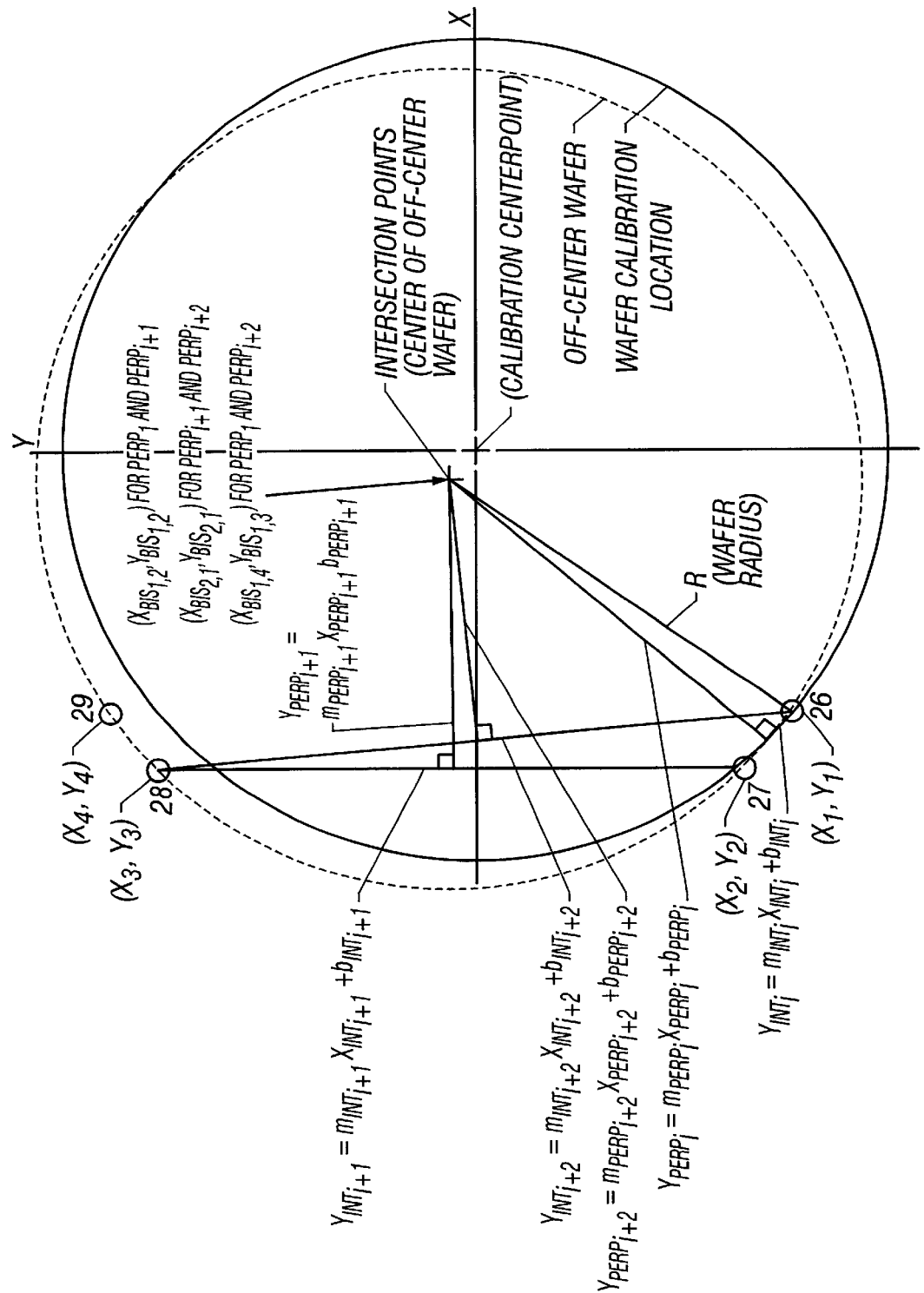

From the wafer centerpoint calculation, the three most closely grouped centerpoints were identified from three sensor transition pairs. These three sensor transition pairs provide three sensor transitions which can be used to generate perpendicular bisector combinations for calculating the wafer's true radius. As an example, if sensor transition pairs (1,2), (1,3), and (2,3) yielded the best three centerpoints (i.e. $C_{1,2}$, $C_{1,3}$, and $C_{2,3}$ are selected as the best three centerpoints), transitions 1 (point 26), 2 (point 27), and 3 (point 28) can be used to calculate the wafer's true radius. FIG. 10 shows the three perpendicular bisector combinations ($Y_{PERPi}$, $Y_{PERPi+1}$, and $Y_{PERPi+2}$) for the best three centerpoints from sensor transitions 1, 2, and 3 {(1,2)(1,3)(2,3)}. The final Radius is found using the resulting average of the intersection points that are found.

A method for finding the wafer's true radius will now be described. The basic equation for a line is:

$$Y_{INTi} = m_{INTi} X_{INTi} + b_{INTi}$$

Between two points in space {$(X_1, Y_1) (X_2, Y_2)$}, the slope and intercept of the line can be found as:

$$m_{INTi} = (Y_2 - Y_1)/(X_2 - X_1)$$

$$b_{INTi} = [(Y_2 + Y_1) - m_{INTi}(X_2 + X_1)]/2$$

The midpoint of this line is found from:

$$X_{MIDi} = X_1 + 0.5(X_2 - X_1)$$

$$Y_{MIDi} = Y_1 + 0.5(Y_2 - Y_1)$$

The equation of the line between these two points can be redefined as:

$$f(x,y) = Y_{INTi} - m_{INTi} X_{INTi} - b_{INTi}$$

The gradient of this equation will yield the slope of the line perpendicular to this function:

$$\Delta f(x,y) = -m_{INTi}\underline{i} + \underline{j} = \text{constant}$$

and $$m_{PERi} = \frac{1}{-m_{INTi}}$$

which is the slope of the line perpendicular to $Y_{INTi}$.

The equation of the line (perpendicular bisector) through the midpoint is:

$$Y_{PERPi} = m_{PERPi} X_{PERPi} + b_{PERPi}$$

where $$b_{PERPi} = Y_{MIDi} - m_{PERPi} X_{MIDi}$$

The same procedure is repeated for a second pair of data points, for example {$(X_2, Y_2) (X_3, Y_3)$}. The equation defining the line between the data points is:

$$Y_{INTi+1} = m_{INTi+1} X_{INTi+1} + b_{INTi+1}$$

and the equation of the line through the midpoint of this second line is:

$$Y_{PERPi+1} = m_{PERPi+1} X_{PERPi+1} + b_{PERPi+1}$$

The intersection point between these two bisector lines in space ($_{PERPi}$=first line, $_{PERPi+1}$=second line) can be found as:

$$X_{BIS_{1,2}} = \frac{(b_{PERP_{i+1}} - b_{PERP_i})}{(m_{PERP_i} - m_{PERP_{i+1}})}$$

$$Y_{BIS1,2} = m_{PERP1} X_{BIS1,2} + b_{PERP1}$$

The same procedure is repeated using the third perpendicular bisector $_{PERPi+2}$ with $_{PERPi}$ and $_{PERPi+1}$. After the three intersection points ($X_{BIS1,2}, Y_{BIS1,2}$), ($X_{BIS2,3}, Y_{BIS2,3}$), and ($X_{BIS3}, Y_{BIS1,3}$) are averaged together to obtain $X_{AVE}$ and $Y_{AVE}$, the radius of curvature can be found as:

$$R_{curve} = R_{true-radius} = [(X_{AVG} - X_i)^2 + (Y_{AVG} - Y_i)^2]^{1/2} \quad \text{(Eq. 30)}$$

where $(X_i, Y_i)$ is any one of the three points making up the intersection point of these two lines in space. Eq. 30 provides the wafer's true radius and can be used to recalculate the wafer centerpoints.

9. Illustrative Example

Figure 6:
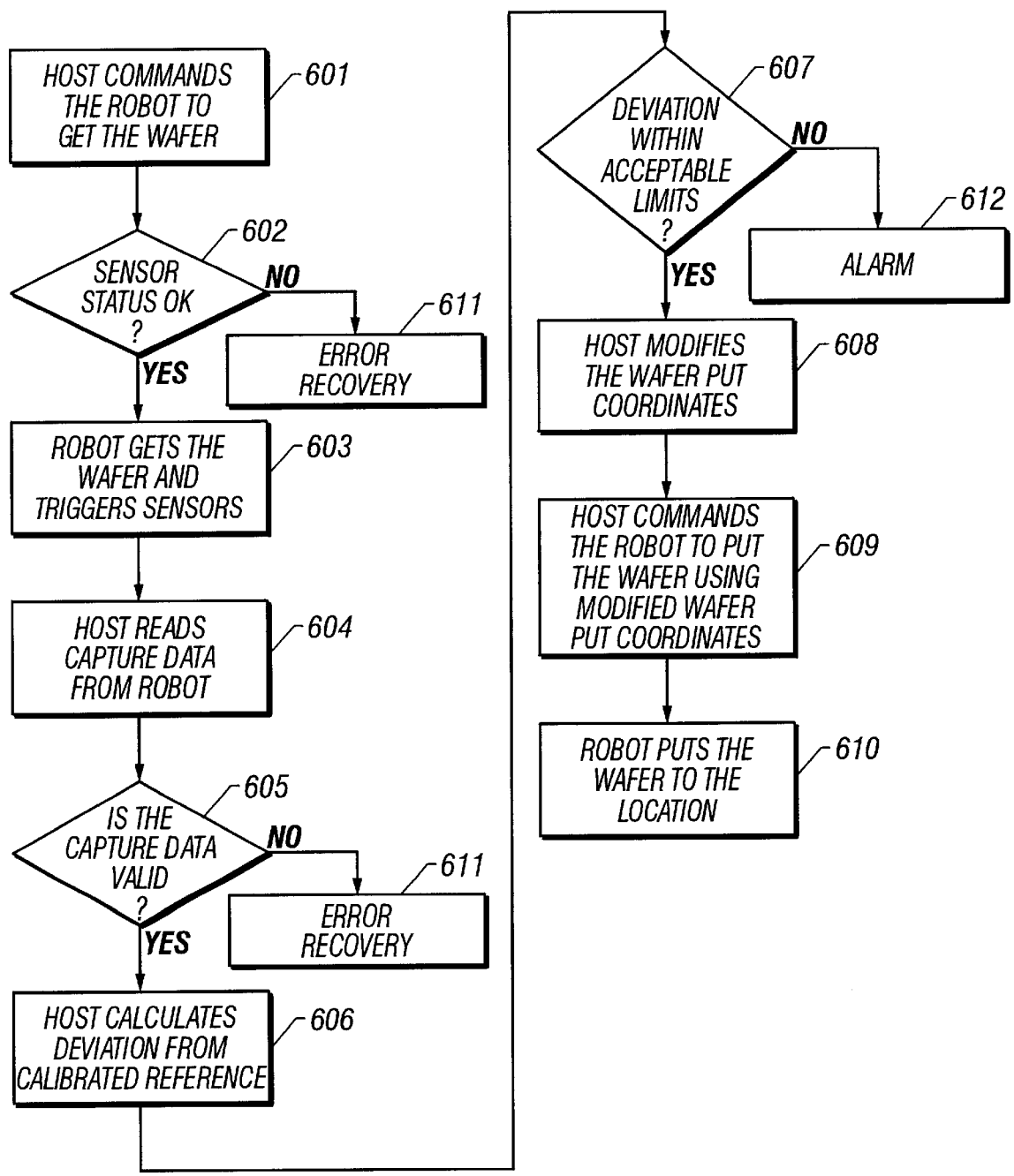
FIGS. 6 and 7 show a method for moving a wafer from one location to another in accordance with the present invention.

Wafer movement in accordance with the present invention is now illustrated with reference to FIG. 6. Moving a wafer from a first location to a second or destination location begins with the host processor commanding the robot to get the wafer from a first location (step 601). The host processor then checks the sensors' status to determine if the sensors are stable and functioning (step 602). If not, an error recovery routine is initiated to correct whatever is wrong with the system (step 611). After the sensor status is validated, the robot picks up and radially retracts the wafer from the first location, thereby triggering the sensors (step 603). The robot captures the sensor transition data generated by the edges of the wafer cutting across the sensors. Detecting sensor transitions while the robot radially retracts the wafer from the first location provides maximum time for the host processor to make corrections before the robot reaches the destination location. This allows for corrections to be made "in the background" while the robot is busy moving to the destination location, thereby avoiding any throughput penalty. For example, while sensor transitions can also be detected while the robot is extending into the destination location (i.e. just before wafer placement), the window of time during which the host processor can make corrections is significantly decreased because the host processor is on the critical time-path as it performs the computations and determines the corrections. The same problem is true with detecting sensor transitions during rotation into the destination location. As is evident to one of ordinary skill in the art, the teachings of the present invention can also be adapted to detect sensor transitions and make corrections as the wafer is being extended towards the destination location. This, of course, will require a robot which can make wafer centering calculations and corrections fast enough such that throughput is not adversely affected.

Once sensor transition data are received by the robot, the host processor reads a packet of data (capture data) from the robot (step 604). The robot is then free to rotate to the destination location. This allows for subsequent host calculation to be performed in the background. The host verifies that the capture data is valid (step 605). If not, an error recovery routine is initiated to correct whatever is wrong with the system (step 611). After the capture data is validated, sensor transition data is extracted from the capture data. The host then calculates the amount by which the wafer's center deviates from the calibrated reference (step 606). If the deviation is not within a correctable range, an alarm is activated to alert the system or the operator (step 612). Otherwise, the host modifies the wafer put coordinates to compensate for the deviation (step 608). During this time, the robot is busy rotating to the destination location. Just before the robot initiates putting the wafer onto the destination location, the host commands the robot to put the wafer into the destination location using the modified wafer put coordinates (step 609). The robot then places the wafer onto the destination location (step 610).

Figure 7:
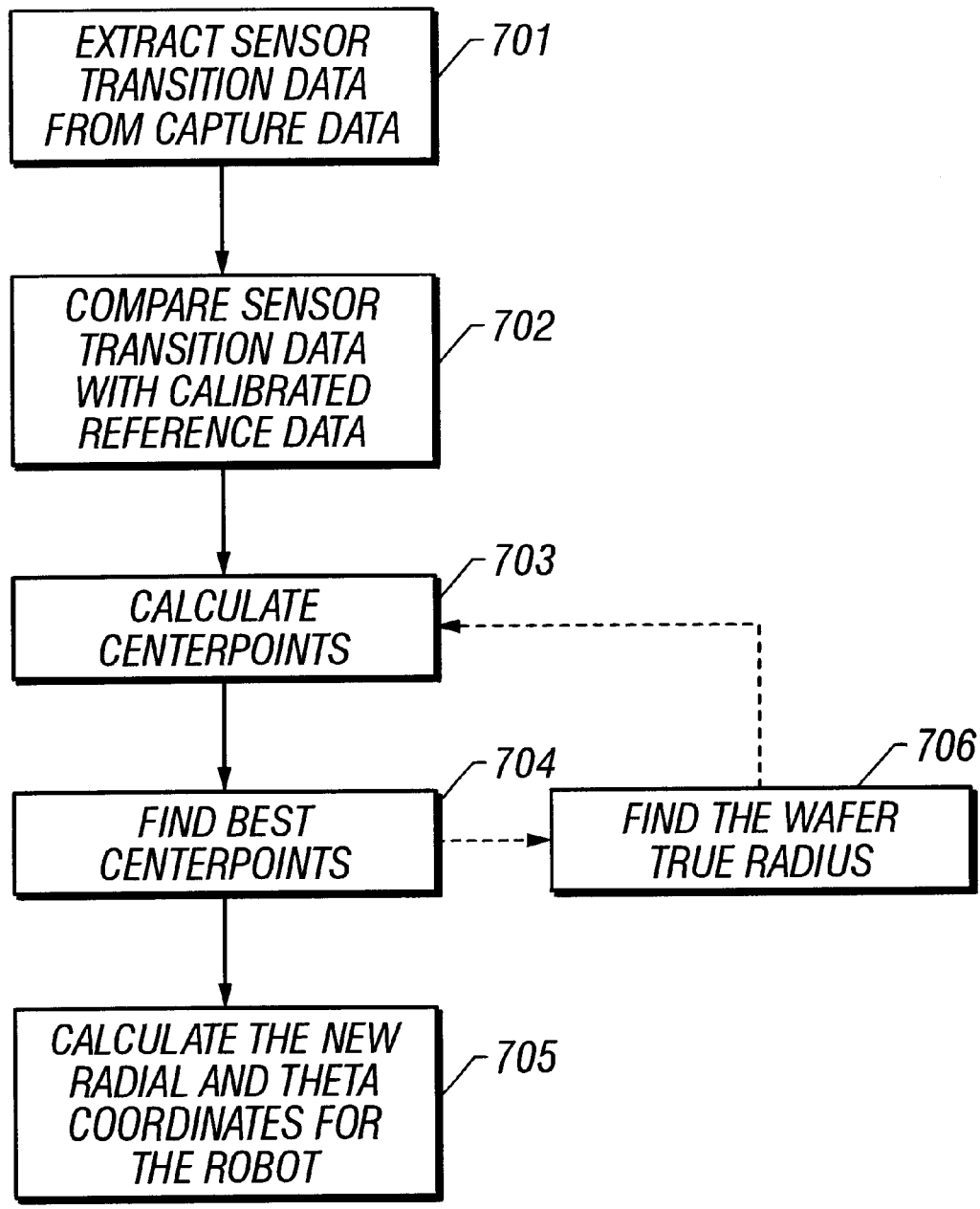

FIG. 7 shows the details of step 606. The host processor extracts sensor transition data from capture data received from the robot (step 701). The received sensor transition data is then compared with the calibrated reference (step 702). From calculations made in step 702, the wafer's centerpoints can be calculated using the nominal radius of the wafer (step 703). In order to discriminate the wafer's notch, the best or closely matched centerpoints are selected (step 704). The best centerpoints are then used to calculate the new radial and theta coordinates for the robot (step 705).

In step 703, centerpoint calculations are made using the wafer's nominal radius. To improve the accuracy of the wafer centerpoint determination, the wafer's true radius can be calculated using information obtained from steps 703 and 704 (step 706). Once the wafer's true radius is found, steps 703 and 704 can be recalculated using the wafer's true radius. Thereafter, step 705 can be performed. Note that the present invention provides for enough accuracy to be practiced without using the optional step 706.

In situations where two robots use the same put or pick-up location, wafer centering information from one robot can be used by the other. As an example, in manufacturing equipment 1 shown in FIG. 1, vacuum robot 6 and atmospheric robot 5 both use load locks 7A and 7B. Vacuum robot 6 can pick up a wafer from load lock 7A (or 7B) and perform a wafer centering calculation. The results of the wafer centering calculation indicate the error caused by atmospheric robot 5 misplacing the wafer on load lock 7A. The wafer centering information obtained using vacuum robot 6 can be used to correct the load lock 7A coordinates of atmospheric robot 5.

The above detailed description is provided to illustrate the specific embodiments of the present invention and is not intended to be limiting. It is to be understood that numerous variations and modifications within the scope of the present invention are possible. The invention is set forth in the following claims.

What is claimed is:

1. A method of detecting the position of a substrate on a robot comprising:

providing a plurality of sensors, each of said sensors being adapted to detect a passage of at least one of a leading and a trailing edge of a substrate;

mounting a calibration substrate at a desired position on said robot;

controlling said robot to cause said calibration substrate to make n passes over said detectors, wherein n is an integer greater than or equal to one;

recording the position of said robot when at least one of a leading edge and a trailing edge of said calibration substrate, respectively, pass over each of said sensors during each of said n passes, thereby providing at least one recorded position for each pass of said robot;

using the recorded positions to calculate a distance $R_{CTR}$ between a location of a reference point of said calibration substrate and a reference axis of said robot;

averaging recorded positions of said robot when said leading edge of said calibration substrate passes over a first one of said sensors during said n passes and subtracting $R_{CTR}$ therefrom to yield a first calibration position $R_{CA}$;

averaging recorded positions of said robot when said leading edge of said calibration substrate passes over a second one of said sensors during said n passes and subtracting $R_{CTR}$ therefrom to yield a second calibration position $R_{CB}$;

averaging recorded positions of said robot when said trailing edge of said calibration substrate passes over said second one of said sensors during said n passes and subtracting $R_{CTR}$ therefrom to yield a third calibration position $R_{CC}$;

averaging recorded positions of said robot when said trailing edge of said calibration substrate passes over said first one of said sensors during said n passes and subtracting $R_{CTR}$ therefrom to yield a fourth calibration position $R_{CD}$;

using said robot to transport an operational substrate along a path with respect to said sensors;

using each of said sensors to detect the passage of at least one of a leading and a trailing edge of said operational substrate, thereby providing a number of transition readings;

using a first selected combination of said transition readings to calculate a first location of said operational substrate, said first location of said operational substrate corresponding to a first calculated reference point on said substrate;

using second and successive selected combinations of said transition readings to calculate second and successive locations, respectively, of said operational substrate, said second and successive locations of said operational substrate corresponding to second and successive calculated reference points, respectively, on said operational substrate;

determining physical relationships between said calculated reference points;

discarding certain of said calculated reference points on the basis of said physical relationships, leaving a number of remaining calculated reference points; and using the remaining calculated reference points to compute a location of a net reference point on said operational substrate.

2. The method of claim 1 wherein using the remaining calculated reference points to compute a location of a net reference point on said operational substrate comprises averaging the respective locations of the remaining reference points.

3. The method of claim 1 wherein each of said transition readings comprises a position of said robot when said leading or trailing edge of said operational substrate passes one of said sensors.

4. The method of claim 3 wherein using the recorded positions to calculate a distance $R_{CTR}$ between a location of a reference point of said calibration substrate and a reference axis of said robot comprises:

adding the recorded positions to arrive at a total; and dividing said total by the number of recorded positions multiplied by n.

5. The method of claim 3 wherein said reference point of said calibration substrate coincides with a centerpoint of said calibration substrate.

6. The method of claim 1 wherein using each of said sensors to detect the passage of the leading and/or trailing edge of said substrate comprises detecting respective locations on the leading and trailing edges of said substrate with each of said sensors such that said number of transition readings is equal to twice the number of sensors.

7. The method of claim 1 wherein each of said calculated reference points coincides with a possible centerpoint of said substrate.

8. The method of claim 7 comprising calculating the respective locations of each of said possible centerpoints.

9. The method of claim 8 wherein calculating the respective locations of said possible centerpoints comprises:

(a) calculating a difference between each of said transition readings and a corresponding calibrated transition reading;

(b) calculating the length of displacement vectors between at least two of said transition readings, respectively, and a value representing a calibrated center of said substrate;

(c) calculating the length of a distance vector between said at least two transition readings;

(d) calculating angular relationships between said displacement vectors and said distance vector;

(e) using said lengths of said displacement vectors and at least one of said angular relationships to calculate a distance between a possible centerpoint and said calibrated center of said substrate; and (f) repeating steps (b) through (e) for other transition readings.

10. The method of claim 9 comprising determining said calibrated transition readings and said value representing the calibrated center of said substrate.

11. The method of claim 10 wherein determining said calibrated transition readings and said value representing the calibrated center of said substrate comprises:

placing a calibration substrate on said robot;

using said robot to transport said calibration substrate along a path with respect to said sensors;

using each of said sensors to detect the passage of the leading and/or trailing edge of said calibration substrate, thereby providing said calibrated transition readings; and using said calibrated transition readings to calculate said calibrated center of said substrate.

12. The method of claim 1 or claim 11 wherein determining physical relationships between said calculated reference points comprises calculating the distances between pairs of said calculated reference points.

13. The method of claim 12 wherein calculating the distances between pairs of said calculated reference points comprises applying the formula $$D = \sqrt{(R_{i,j}\sin(\xi_{i,j}) - R_{k,l}\sin(\xi_{k,l}))^2 + (R_{i,j}\cos(\xi_{i,j}) - R_{k,l}\cos(\xi_{k,l}))^2}$$

wherein D is the distance between a pair of said calculated reference points, $R_{i,j}$ and $R_{k,l}$ are the radial coordinates of said pair of calculated reference points, respectively, in a polar coordinate system and $\xi_{i,j}$ and $\xi_{k,l}$ are the angular coordinates of said pair of calculated reference, points, respectively, in said polar coordinate system.

14. The method of claim 13 wherein determining physical relationships between said calculated reference points comprises arranging said calculated reference points into groups of three and summing the distances between the calculated reference points in each group of three to arrive at a total distance for each group of three.

15. The method of claim 14 wherein determining physical relationships between said calculated reference points comprises identifying an optimal group of three, said optimal group of three being the group of three that has the smallest total distance.

16. The method of claim 15 wherein discarding certain of said calculated reference points on the basis of said physical relationships comprises discarding the calculated reference points other than the calculated reference points that are included in said optimal group of three.

17. The method of claim 16 wherein at least one of said discarded calculated reference points is based at least in part on bad data or on data relating to a notch on said substrate.

18. The method of claim 16 wherein using the remaining calculated reference points to compute a location of a net reference point on said substrate comprises decomposing the remaining calculated reference points in said optimal group of three into their respective rectangular coordinates and averaging the rectangular coordinates to obtain the coordinates $\Delta X_{net}$ and $\Delta Y_{net}$ of said net reference point.

19. The method of claim 1 comprising:

identifying transition pairs associated with said remaining calculated reference points; and using said transition pairs associated with said remaining calculated reference points to calculate a true radius of said substrate.

20. The method of claim 19 wherein using said transition pairs associated with said remaining calculated reference points to calculate a true radius of said substrate comprises:

defining a perpendicular bisector between each of said transition pairs associated with said remaining calculated reference points;

determining locations of intersection points between said perpendicular bisectors; and using the locations of said intersection points to calculate said true radius of said substrate.

21. The method of claim 20 wherein using the locations of said intersection points to calculate said true radius of said substrate comprises calculating an average of said intersection points.

22. The method of claim 19 comprising using said true radius of said substrate to recalculate said calculated reference points.

23. A method of detecting the position of a substrate on a robot comprising providing a plurality of sensors, each of said sensors being adapted to detect a passage of a leading and/or trailing edge of said substrate;

mounting a calibration substrate at a desired position on said robot;

controlling said robot to cause said calibration substrate to make n passes over said detectors, wherein n is an integer greater than or equal to one;

calculating a first compensation factor $R_{ADComp}$ to compensate for the fact that a line intersecting said sensors is not orthogonal to a path of said calibration substrate during said n passes;

recording the position of said robot when at least one of a leading edge and a trailing edge of said calibration substrate, respectively, pass over each of said sensors during each of said n passes, thereby providing at least one recorded position for each pass of said robot;

using the recorded positions to calculate a distance $R_{CTR}$ between a location of a reference point of said calibration substrate and a reference axis of said robot;

using said robot to transport an operational substrate along a path with respect to said sensors;

using each of said sensors to detect the passage of at least one of a leading and a trailing edge of said operational substrate, thereby providing a number of transition readings;

using a first selected combination of said transition readings to calculate a first location of said operational substrate, said first location of said operational substrate corresponding to a first calculated reference point on said operational substrate;

using second and successive selected combinations of said transition readings to calculate second and successive locations, respectively, of said operational substrate, said second and successive locations of said substrate corresponding to second and successive calculated reference points, respectively, on said operational substrate;

determining physical relationships between said calculated reference points;

discarding certain of said calculated reference points on the basis of said physical relationships, leaving a number of remaining calculated reference points; and using the remaining calculated reference points to compute a location of a net reference point on said operational substrate.

24. The method of claim 23 wherein calculating $R_{ADComp}$ comprises:

averaging recorded positions of said robot when said leading edge of said calibration substrate passes over a first one of said detectors during said n passes to arrive at a first average;

averaging recorded positions of said robot when said trailing edge of said calibration substrate passes over said first one of said detectors during said n passes to arrive at a second average;

adding said first and second averages;

dividing a result of said addition by 2; and subtracting $R_{CTR}$ from a result of said division.

25. The method of claim 23 comprising calculating a second compensation factor $R_{BCComp}$ to compensate for the fact that a line intersecting said sensors is not orthogonal to a path of said calibration substrate during said n passes.

26. The method of claim 25 wherein calculating $R_{BCComp}$ comprises:

averaging recorded positions of said robot when said leading edge of said calibration substrate passes over a second one of said detectors during said n passes to arrive at a third average;

averaging recorded positions of said robot when said trailing edge of said calibration substrate passes over said second one of said detectors during said n passes to arrive at a fourth average;

adding said third and fourth averages;

dividing a result of said addition of said third and fourth averages by 2; and subtracting $R_{CTR}$ from a result of said division of said third and fourth averages.

27. The method of claim 25 comprising calculating a plurality of calibration positions by averaging recorded positions of said robot when said leading edge of said calibration substrate passes over a first one of said detectors during said n passes and subtracting $R_{CTR}$ and $R_{ADComp}$ therefrom to yield a first calibration position $R_{CA}$;

averaging recorded positions of said robot when said leading edge of said calibration substrate passes over said second one of said detectors during said n passes and subtracting $R_{CTR}$ and $R_{BCComp}$ therefrom to yield a second calibration position $R_{CB}$;

averaging recorded positions of said robot when said trailing edge of said calibration substrate passes over said second one of said detectors during said n passes and subtracting $R_{CTR}$ and $R_{BCComp}$ therefrom to yield a third calibration position $R_{CC}$; and averaging recorded positions of said robot when said trailing edge of said calibration substrate passes over said first one of said detectors during said n passes and subtracting $R_{CTR}$ and $R_{ADComp}$ therefrom to yield a fourth calibration position $R_{CD}$.

28. The method of claim 1 or claim 27 comprising calculating a distance $i_{CA}$ between a path of said center of said calibration substrate and said first sensor according to the formula:

$$i_{CA} = \frac{[R_{wafer}^2 - R_{CA}^2]^{1/2} + [R_{wafer}^2 - R_{CD}^2]^{1/2}}{2},$$

wherein $R_{wafer}$ is a radius of the calibration substrate.

29. The method of claim 28 comprising calculating a distance $i_{CB}$ between said path of said center of said calibration substrate and said second sensor according to the formula:

$$i_{CB} = \frac{[R_{wafer}^2 - R_{CB}^2]^{1/2} + [R_{wafer}^2 - R_{CC}^2]^{1/2}}{2}.$$

30. A method of detecting the position of a substrate on a robot comprising:

providing a plurality of sensors, each of said sensors being adapted to detect a passage of at least one of a leading and a trailing edge of said substrate;

using said robot to transport said substrate along a path with respect to said sensors;

using each of said sensors to detect the passage of at least one of the leading and trailing edge of said substrate, thereby providing a number of transition readings;

using a first selected combination of said transition readings to calculate a first location of said substrate, said first location of said substrate corresponding to a first calculated reference point on said substrate;

using second and successive selected combinations of said transition readings to calculate second and successive locations, respectively, of said substrate, said second and successive locations of said substrate corresponding to second and successive calculated reference points, respectively, on said substrate;

determining physical relationships between said calculated reference points;

discarding certain of said calculated reference points on the basis of said physical relationships, leaving a number of remaining calculated reference points;

using the remaining calculated reference points to compute a location of a net reference point on said substrate; and using said net reference point to calculate modified put coordinates for said substrate so as to correct for an offset in the position of said substrate on said robot;

wherein using said net reference point to calculate modified put coordinates comprises applying the formulas $$\Delta T_{NEW} = -a\tan\left(\frac{\Delta X_{NET}}{R_{PUT} + \Delta Y_{NET}}\right) + T_{PUT}$$

wherein $R_{PUT}$ and $T_{PUT}$ are original radial and angular put coordinates, respectively, in a polar coordinate system, $\Delta X_{NET}$ and $\Delta Y_{NET}$ are rectangular coordinates of said net reference point, and $R_{NEW}$ and $T_{NEW}$ are said modified radial an angular put coordinates, respectively, in said polar coordinate system.

* * * * *